Figure 1:
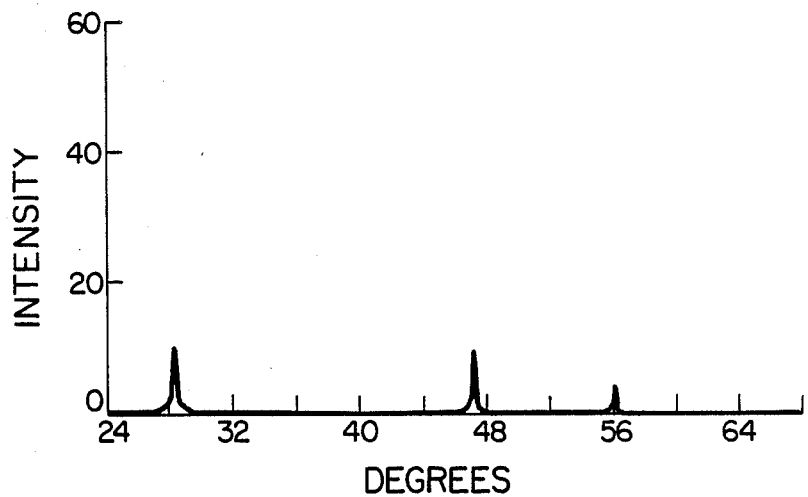

United States Patent [19]

Flagella et al.

[11] Patent Number: 4,921,026

[45] Date of Patent: May 1, 1990

[54] POLYCRYSTALLINE SILICON CAPABLE OF YIELDING LONG LIFETIME SINGLE CRYSTALLINE SILICON

[75] Inventors: Robert N. Flagella, Ridgefield; Howard J. Dawson, Washougal, both of Wash.

[73] Assignee: Union Carbide Chemicals and Plastics Company Inc., Danbury, Conn.

[21] Appl. No.: 201,567

[22] Filed: Jun. 1, 1988

[51] Int. Cl.⁵ ............................................. C30B 13/16
[52] U.S. Cl. .................................. 148/33; 156/620.73
[58] Field of Search ................... 156/620.73; 427/57; 423/349, 350; 148/33

[56] References Cited

U.S. PATENT DOCUMENTS

| | | | |
|---|---|---|---|
| 4,040,848 | 8/1977 | Greskovich et al. | 423/289 |
| 4,132,763 | 1/1979 | Schmidt et al. | 423/350 |
| 4,150,168 | 4/1979 | Yatsuruei et al. | 427/51 |
| 4,170,667 | 10/1979 | Rodgers | 423/349 |
| 4,312,700 | 1/1982 | Helmreich et al. | 156/616.41 |
| 4,681,652 | 7/1987 | Rogers et al. | 156/613 |
| 4,722,764 | 2/1988 | Herzer et al. | 156/620.73 |
| 4,826,668 | 5/1989 | Breneman et al. | 423/349 |

FOREIGN PATENT DOCUMENTS

| | | | |
|---|---|---|---|
| 0700233 | 12/1964 | Canada | 156/620.73 |
| 0158655 | 1/1983 | Fed. Rep. of Germany | 156/620.73 |
| 0065719 | 5/1977 | Japan | 156/620.73 |
| 0001463 | 1/1978 | Japan | 156/620.73 |

Primary Examiner—Brian E. Hearn
Assistant Examiner—Trung Dang
Attorney, Agent, or Firm—Morris N. Reinisch

[57] ABSTRACT

Polycrystalline silicon rod capable of providing within no more than two floating zoning passes, unicrystalline silicon exhibiting a resistivity of at least 10,000 ohm-cm (donor) and a lifetime of at least about 10,000 milliseconds, exhibits a copper X-ray diffraction pattern having a peak at 26.85°±0.25° (2 theta) and has less than 15 ppta boron and less than 20 ppta phosphorus.

10 Claims, 5 Drawing Sheets

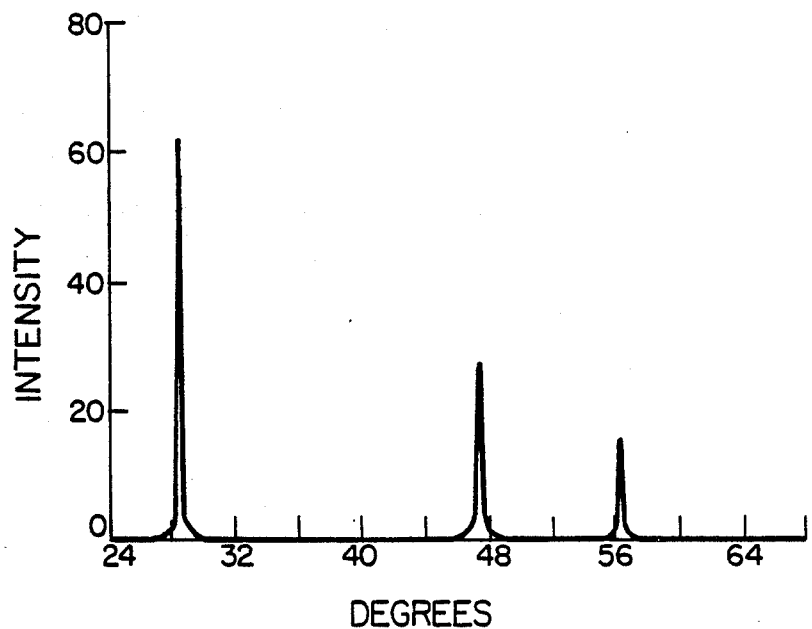
F I G. 4
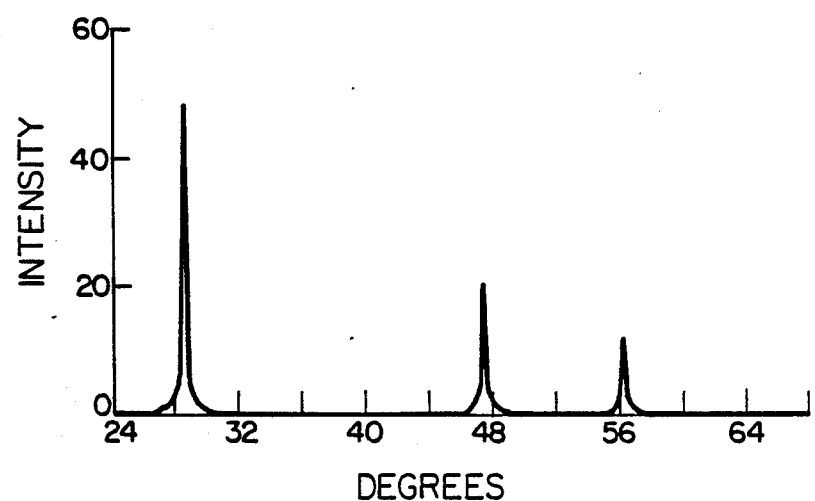
F I G. 5

POLYCRYSTALLINE SILICON CAPABLE OF YIELDING LONG LIFETIME SINGLE CRYSTALLINE SILICON

This invention relates to high purity polycrystalline silicon prepared by the decomposition of silane or halogen-substituted silane which is capable of yielding long lifetime single crystalline silicon for electronics applications.

BACKGROUND OF THE INVENTION

Single crystalline silicon (unicrystalline silicon) is useful in the electronics industry and finds utility particularly in semiconductors and photodetectors. As electronic devices become more sophisticated, the need for high purity, relatively defect free unicrystalline silicon is sought. Indeed, the United States government is actively supporting research programs to produce highly pure, relatively defect-free unicrystalline silicon.

Typical characteristics sought for highly pure, relatively defect free unicrystalline silicon are high resistivities and long lifetimes. The resistivities of semiconductor materials are affected by ionizable impurities, e.g., boron, phosphorus, arsenic, aluminum, heavy metals, etc. The lifetimes of these materials pertain to the time that a carrier in the material stays free and contributes to the electrical conductivity of the material. When the carrier is recombined, its lifetime is terminated. Recombination can occur at imperfections within unicrystalline silicon or by combination with an oppositely charged carrier, e.g., from impurities. Hence, unicrystalline material that is free from defects and ionizable impurities would be expected to exhibit very long lifetimes. It should be recognized that some increase in activities and lifetimes can be obtained by inclusion of materials (dopants) that can neutralize the effect of the ionizable impurities and materials that can trap carriers.

The primary commercially employed methods for producing unicrystalline silicon are the well-known Czochralski technique and the float zone techniques, both of which use polycrystalline silicon as the feed material. In the Czochralski technique, particles of polycrystalline silicon are melted in a crucible and unicrystalline silicon is drawn from the melt. The float zone process does not use a crucible. Rather, a rod of polycrystalline silicon is heated in a zone with unicrystalline silicon being drawn from the heated zone. The float zone technique, since the silicon is not contained within a crucible, is generally thought to be able to provide unicrystalline silicon containing less impurities. Recent efforts, however, are being directed to magnetic Czochralski techniques in which the high temperature silicon melt is maintained localized within the center of the crucible, thereby minimizing contamination from the crucible. Nonetheless, impurities in the parts per trillion (atom basis) range can adversely affect resistivities and lifetimes of unicrystalline silicon and thus even spurious atoms emitted from induction heaters as used in the float zone technique are serious considerations.

The purity of the polycrystalline silicon feedstock will affect the purity of the unicrystalline silicon. Polycrystalline silicon is commercially manufactured by the thermal decomposition of silane or a halogenated silane. The temperatures of the deposition may range from 400° C. to over 1200° C. depending upon whether silane or a halogenated silane is used. Sources of impurities are multifold. For instance, impurities such as boron, phosphorus, aluminum and arsenic are typically found in silicon sources used to make the silane or halogenated silane. Trace amounts of heavy metals can be picked up from the processing equipment. Carbon may be introduced from gasketing materials, lubricants, inerting gases and the like. Of course, with halogenated silanes, the halogen is an impurity that may be present in the polycrystalline silicon.

With some impurities, the conversion to unicrystalline silicon can effect some purification. For instance, the phosphorus content can be reduced by the conversion to unicrystalline silicon and further reduced by drawing the crystal. The distribution coefficient (segregation coefficient) of impurities between the melt and crystal also plays a role. Usually, the incorporation of the impurity into the crystal structure will be at a lesser content than the concentration of the impurity in the melt. However, as the crystal is drawn, the impurity becomes more concentrated in the melt, leading to more impurity being incorporated into the later formed portions of the crystal. Neither of these techniques are fully satisfactory to alleviate loss of resistivity and lifetimes due to impurities, and can result in shortcomings such as inducing contamination through multiple drawings of the unicrystalline silicon or loss of yield from the polycrystalline silicon. Furthermore, for impurities such as boron which has a distribution coefficient of about 0.8, these techniques are not viable for removing the contaminants.

Accordingly, highly pure polycrystalline silicon is a desired feedstock to make unicrystalline silicon with high resistivities and long lifetimes. Typical commercial polycrystalline silicon of float zone grade (i.e., higher purity than the grades used for the Czochralski technique) ranges in boron content from about 20 to 30 parts per trillion (atom basis) (ppta) and phosphorus, 30 to 100 ppta, after float zoning to produce unicrystalline silicon. Despite efforts being applied by various researchers in the field, no commercial polycrystalline silicon has been available which will provide a unicrystalline silicon made by the float zone technique having less than 20 ppta boron and 20 ppta phosphorus with high resistivities, e.g., greater than 10,000 ohm cm, and long lifetimes, e.g., in excess of about 10,000 microseconds (ASTM F-28-75, reapproved 1981). Not only will the presence of impurities adversely affect the resistivity and lifetime of the unicrystalline silicon, but also defects in the crystal will reduce resistivity and lifetime. While the defects can be reduced by multiple drawings of the unicrystalline silicon, e.g., repeated float zoning operations, a trade-off exists due to the contamination of the unicrystalline silicon inherent in the float zoning process.

Heretofore, workers in the field have proposed numerous processes for preparing polycrystalline silicon. The Siemens process, which appears to be the most widely practiced commercial process, involves the decomposition of trichlorosilane at about 1000° C. The silicon is deposited on heated rods, usually electrified to maintain the temperature. The deposition of silicon from $SiX_4$ or $SiHX_3$ (X is Cl, Br, I) is disclosed in U.S. Pat. Nos. 3,012,862 and 4,054,024. Silicon tetrachloride (decomposition temperature of about 1200° C.) and silicon tetraiodide (decomposition temperature of about 900° C.) have also been proposed. Several manufacturers decompose silane (temperatures of 400° to 900° C.) to form polycrystalline silicon. The decomposition can be on a heated rod or in a fluid bed. Another proposal has been the decomposition of tribromosilane at 600° to 800° C. to form polycrystalline silicon. Dichlorosilane can also be decomposed to silicon.

Some attention has been paid to the nature of the polycrystalline silicon product. U.S. Pat. No. 4,255,463 is directed to a method for the decomposition of trichlorosilane (or other silicon halogen compound) under conditions that provide a fine-crystalline surface. The patentees state at column 1, lines 38 to 44:

"It has been found that during the production of polycrystalline silicon rods, a coarse crystalline growth occurs, at times, leading to the occurrence of considerable crystal lattice faults during subsequent production of monocrystalline rods from these polyrods in crucible free floating zone melting process."

The patent, however, provides no details of the physical properties of the polycrystalline silicon other than at column 4, lines 3 to 6:

"With the method according to the invention, it has been possible to reduce the size of the crystallites to about ⅓ as compared to the hereinaforementioned conventional method."

Commercially available polycrystalline silicon made by the decomposition of trichlorosilane typically has large grain sizes readily observable by optical microscopy, e.g., 10,000 to 250,000 angstroms. Earlier, Dyer, in U.S. Pat. No. 3,540,871 proposed a halosilane decomposition process in which the temperature in the decomposition reactor is controlled to affect the substrate upon which the silicon is being grown. This process is said to promote defects, e.g., twins, and promote polycrystalline growth. Commercially-available polycrystalline silicon made by the decomposition of silane generally has crystallite sizes ranging from about 100 to 500 angstroms.

SUMMARY OF THE INVENTION

In accordance with this invention, polycrystalline silicon is provided which is capable of providing within no more than two float zoning passes, unicrystalline silicon having a boron content of less than about 15 ppta, a phosphorus content of less than about 15 ppta, a resistivity of at least 10,000 ohm cm (donor) and a lifetime of at least about 10,000 microseconds. Accordingly, not only is the unicrystalline material relatively free from impurities, but also it is relatively free from crystal defects. The polycrystalline silicon of this invention is a rod containing any starter filament used in its manufacture and having a diameter of at least about 50 millimeters and a length of at least 0.5 meter. Preferably, the density of the growth layer of the rod is at least 2.30, preferably 2.30 to 2.32, grams per cubic centimeter. The polycrystalline material exhibits an X-ray powder diffraction pattern having a peak at 26.85±0.25° (2 theta) which is at least about 1.75 percent of the intensity of the (111) peak at about 28.5°. The full width at half maximum (FWHM) of the (111) peak (about 28.5° (2 theta)) is advantageously at least about 0.27°, preferably at least about 0.30°, say about 0.30° to 0.50°. The boron and phosphorus content of the polycrystalline silicon rod, calculated from analyses of the unicrystalline silicon produced by float zoning the polycrystalline silicon once, is less than 15 ppta boron and less than 20 ppta, preferably less than 15 ppta, phosphorus. In some embodiments of this invention, the polycrystalline structure is oriented in a direction parallel to the axis of the rod as can be observed by optical microscopy (resolution 0.5 micrometers) of a cross section of the polycrystalline rod perpendicular to the axis of the rod and a cross-section parallel to the axis of the rod.

The polycrystalline silicon of this invention can advantageously be used to produce high purity, unicrystalline silicon by any suitable technique. It can readily be appreciated that techniques such as float zoning and magnetic Czochralski may take better advantage of the high purity properties of the polycrystalline silicon of this invention. Moreover, the polycrystalline silicon of this invention can be desirably converted to unicrystalline silicon which is relatively free from structural defects with one or two float zone passes.

DETAILED DISCUSSION

Highly pure polycrystalline silicon characterized by having a high density and an X-ray powder diffraction peak at about 26.85±0.25° (2 theta) and an FWHM of the (111) peak of at least about 0.27° (2 theta), can readily form relatively defect-free unicrystalline silicon by float zoning. While not wishing to be limited by theory, the proportion of grain boundaries and the characteristic X-ray pattern are believed to enable the desired crystalline structure to be readily obtained. Unicrystalline silicon is characterized as having three identifying X-ray pattern peaks between 5° to 57° using copper radiation, a major peak (111) at 28.5° and two smaller peaks at 47.3 (220) and 56.2° (311). It should be recognized that depending upon the x-ray source, one or more of these three peaks may appear as two peaks. No peak exists at 26.85° in unicrystalline silicon.

Commercial polycrystalline silicon obtained by the decomposition of trichlorosilane generally does not appear to have (or if it does have, it is very minor) the characteristic peak at 26.85±0.25°. The cause of the peak at about 26.85° of the polycrystalline silicon of this invention not known; however, it is likely that it is due to a repeating phenomenon within the crystal structure in the polycrystalline silicon crystallites. This phenomenon may assist in facilitating removal of impurities and/or in enabling a relatively defect-free unicrystalline structure to be formed. Preferably, the intensity of the peak at 26.85±0.25° is at least about 1.75, preferably at least about 2, percent, say, about 2 to 10 or 15 percent of the intensity of the (111) peak.

The full width at half maximum of the (111) peak provides information regarding the crystallite size in the polycrystalline silicon. Generally, the smaller the FWHM, the larger the crystallite size. The FWHM is also influenced by stress within the crystallites, with greater stress providing a potential source for broadening the FWHM. The FWHM of the polycrystalline silicon of this invention is often at least about 0.27°.

The X-ray powder diffraction patterns can conveniently be determined by using copper X-ray radiation. Adequate definition can be generally achieved with a 24 to 68 degrees (2 theta) scan, 0.05 degree receiving slit, 0.01 degrees per step and 2.0 seconds per step.

Analytical efforts conducted after making this invention demonstrate that commercially-available polycrystalline silicon prepared by the decomposition of silane also can exhibit an X-ray powder diffraction pattern peak at 26.85±0.25° (2 theta). However, this commercially available polycrystalline silicon does not provide the high purity, high performance unicrystalline silicon that can be provided by this invention, and this peak intensity is generally less than 1.75 percent of the (111) peak intensity.

The high density of the preferred polycrystalline silicons of this invention also is believed to assist in providing high performance unicrystalline silicon. Unicrystalline silicon has a density of about 2.33 grams per cubic centimeter. The polycrystalline silicon of this invention is characterized by having a large number of defects such as twinning, stacking faults and dislocations, but these defects, while plentiful, are on a small scale.

Analytical techniques for reliably and directly measuring the levels of all impurities in polycrystalline silicon do not now exist. Moreover, it is not only the content of impurities but also how the impurities are taken-up by a unicrystalline silicon product that is important for polycrystalline silicon performance. Accordingly, for impurities such as boron, phosphorus, arsenic, aluminum and the like, analytical measurements are believed to be best performed on unicrystalline silicon formed from the polycrystalline silicon. Distribution coefficients can be used to back calculate the concentration of these impurities in the polycrystalline silicon.

One useful analytical tool is Fourier Transform Photoluminescence. This technique involves cooling the unicrystalline silicon to 4.2° K. and photoexciting the sample with a greater than ban gap energy light at a specific intensity. A decay of the excited species can be observed by luminescence. The wavelength of this luminescence is unique to each complex and thus identification of the impurity can be based on the wavelength. The concentration of the impurity is reflected in the quantity of luminescence of peak height relative to the silicon intrinsic peak. Sensitivities to as little as 1 ppta have been demonstrated. Fourier transform infra red analysis techniques under cryogenic conditions can also be useful but generally are not as sensitive as Fourier transform photoluminescence techniques.

The boron concentration in the unicrystalline silicon made by float zoning the polycrystalline silicon of this invention is less than about 15 ppta, often about 4 to 12 ppta, and the phosphorus is less than about 15 ppta, often about 4 to 12 ppta. Arsenic is preferably below about 2 ppta. The carbon content of the polycrystalline silicon of this invention is below about 0.2 parts per million (atom basis) (ppma), preferably below about 0.1 ppma. Advantageously, the aluminum content can be less than 5 ppta.

The samples of unicrystalline silicon can be prepared for analysis by any competent float zoning technique. It is well recognized in the art that the float zoning operation can have an affect on the quality of the sample, e.g., by introducing impurities or developing defects in the crystalline structure. One technique for float zoning to produce samples for analysis is to prepare by grinding a polycrystalline silicon rod about 50±1 millimeter in diameter. The rod contains the unicrystalline filament (starter filament) on which the growth occurs. The rod is also appropriately tapered for the float zone apparatus. After machining, the rod must be carefully cleaned to remove any contaminants. Conventional cleaning operations include degreasing, etching (e.g., with a hydrogen fluoride-nitric acid- acetic solution) and rinsing in distilled and deionized water. The float zoning is conducted by heating the rod by induction heating to a red hot state to provide a molten zone of about 15 millimeters. Usually the rod has to be preheated to about 175° to 250° C. before induction heating is effective. This heating is frequently done by energizing a tantalum plate with the induction heater and the tantalum plate, which becomes hot, radiates heat to the polycrystalline silicon.

A seed crystal is used in drawing the unicrystalline silicon, and usually the crystal is grown within 0.25° of the (111) direction. The diameter of the grown crystal is about 22 to 25 millimeters and the crystal is drawn at a rate of about 3 to 3.5 millimeters per minute. The polycrystalline silicon rod and crystal product are rotated. Although various rates of rotation can be used, the polycrystalline silicon rod can be rotated at about 0.5 rpm and the formed crystal at about 7 rpm in the opposite direction. The float zoning is conveniently conducted in an argon environment. Samples of the unicrystalline rod prepared using the melt zone of 15 millimeters in length can be taken for analysis at 90 millimeters and 150 millimeters from the starting end of the unicrystalline silicon rod.

When float zoning unicrystalline silicon for commercial use, much larger diameter crystals are sought, e.g., 70 to 150 or more millimeters. Similar polycrystalline silicon rod preparation is done, except that the diameter of the polycrystalline silicon rod is generally larger, e.g., up to 150 or more millimeters. Achieving relatively defect free crystal structures in these larger diameter crystals has traditionally been more difficult regardless of the polycrystalline silicon quality. The polycrystalline silicon of this invention is advantageous for forming these larger diameter crystals. In some instances, the conversion to unicrystalline form can be facilitated by a prepass of the polycrystalline silicon rod through the float zoning apparatus. The rate of which the drawn product is formed may be two or three times as fast as that which the ultimate crystal will be drawn. The product from this prepass contains unicrystalline segments. The prepass product can then be drawn in the normal manner to form a relatively defect-free unicrystalline product.

The resistivities of the unicrystalline silicon prepared using the polycrystalline silicon of this invention can be very high, often at least about 10,000 ohm-cm (donor) and sometimes in excess of 30,000 ohm-cm (donor) or more. Lifetime measurements can be made in accordance with ASTM F-28-75, reapproved 1981. Because the lifetimes of the unicrystalline silicon prepared using the polycrystalline silicon of this invention can be extraordinarily long, e.g., at least about 10,000, often at least about 20,000 or 30,000 microseconds, ancillary effects not related to the quality of the unicrystalline silicon will influence the measurement of the lifetimes. One of these effects is the ratio of surface area to volume of the crystalline sample. With high ratios, the carriers will more frequently contact the surface layer and be recombined or trapped because of the surface effects, thus giving a lower than theoretical lifetime for the unicrystalline silicon itself.

As stated in the background section, polycrystalline silicon can be obtained by the thermal decomposition of various halogen containing silicon compounds and silane. These techniques are well known. In general, the preparation of rods of polycrystalline silicon is through the decomposition of the silicon containing gas on a hot filament. The hot filament is preferably unicrystalline silicon, and the temperature of the filament (say, 400° C. to 1200° C. depending upon the silicon-containing compound and the sought rate of deposition) is maintained by passing an electrical current through the rod. In some reactions, e.g., those used for the decomposition of trichlorosilane, the filaments are initially heated by a separate heat source to the point at which the filaments conduct sufficient electrical current to enable the filaments to be self-heating. Alternatively, the filaments may be doped with materials that enable the filament to conduct sufficient current to enable heating without external heating sources (e.g., as much as 8 ppba phosphorus). A recent invention by Union Carbide has enabled filaments with little, if any, dopants to be started without external heating by selectively passing a current which would otherwise be passed to a multiple number of filaments in an array to only a minority of the filaments. Thus, a limited source of electrical current can be effectively used to heat filaments having very high resistivities. Once the silicon is warmed from ambient room temperature, the conductivity of the silicon filament increases such that the current can be used to start the other filaments in the array.

The temperature of the filaments and the polycrystalline silicon growth surface as the rod is formed will vary depending upon the silicon-containing compound being decomposed and the desired rate of deposition. In general, halosilanes and tetrahalosilicon compounds require higher temperatures, e.g., 600° to 1200° C. or more. Silane, however, is capable of decomposition at lower temperatures, e.g., 400° C. or less, than most halosilanes, although higher temperatures can be used.

The decomposition is typically conducted in a sealed vessel. Quartz vessels had been used in the industry, but steel vessels are now commonplace. The walls of the vessels are typically cooled, e.g., to 25° to 90° C. to minimize decomposition on the vessel surface. With conventional trichlorosilane decomposition vessels, a large array of starter filaments one in open relation to another are contained within the vessel. Because of the tendency of silane to homogeneously decompose, i.e., a silicon powder is produced rather than silicon growth on the filament, silane decomposition reactors generally isolate each filament from others to avoid undue hot zones which can promote the homogeneous decomposition. U.S. patent application Ser. No. 62,256, filed June 11, 1987, by W. C. Breneman, et al., discloses improved processes for the production of ultra high purity polycrystalline silicon from silane in which the filament is contained within a cooled enclosure having an effective radius of about 6 to 23 centimeters, the silane concentration within the cooled enclosure is at least 0.5 mole percent, homogeneous decomposition powder and gases are withdrawn from the cooled enclosure and the gases are recycled at a rate of at least about 50,000 cubic centimeters per minute to the enclosure. Frequently, the recycled effluent is 20 to 2000 cubic meters per hour per kilogram per hour of silicon production.

The concentration of the silicon-containing compound in the reaction may vary widely. With tetrahalosilicon and trihalosilane, the concentration may be higher than with the more readily decomposable silane. Often, the gases in the reactor comprise about 0.5 to 30 volume percent of the silicon-containing compound. While other inert gases could be used, hydrogen, a product of the decomposition of halosilanes and silane, typically comprises the balance of the gases in the reactor.

Silane is the preferred silicon containing compound for producing the polycrystalline silicon of this invention. One reason is that silane can be easily separated by distillation from phosphine and diborane, troublesome contaminants of silicon-containing compounds. The higher boiling points of, e.g., trichlorosilane does not permit an effective separation by distillation. Various methods have been proposed for separating phosphine and diborane from trichlorosilanes such as the use of molecular sieve adsorbents. The adsorbents, however, can be a source of contamination, e.g., of aluminum. The specifications of ultrahigh purity silicon established by the United States government seek aluminum impurities in amounts less than about 20 ppta. With silane manufactured from metallurgical silicon, aluminum concentrations of less than 3 ppta are common. Moreover, silane decomposition typically provides smaller grains and crystallites of polycrystalline silicon than does, for instance, trichlorosilane. When silane is used, the concentration of silane in the reactor is often about 0.5 to 10, preferably, 1.0 to 5, mole percent. Because of the homogeneous decomposition tendencies of silane, the temperature of the filament is normally adjusted to provide a desired growth rate without undue powder formation. The powder has a tendency to collect on the surfaces of the reactor and, if the build-up is too great, the build-up will separate from the reactor surfaces and could contact and contaminate the rod being grown.

The pressure in the reactor is typically maintained constant and is typically at atmospheric or slightly higher, e.g., up to 10 atmospheres, pressure, to minimize the risk of any of the ambient atmosphere leaking into the reactor due to the explosive nature of some of the possible silicon-containing compounds such as dichlorosilane and silane.

The size of the polycrystalline silicon rods may vary depending upon the desired use. For instance, for float zoning, the rod should be of a diameter suitable for use in the float zoning equipment. Generally, the length of the starter filament is about 2 meters although longer and shorter, e.g., 0.5 to 3 meters, lengths may find application. The length of the starter filament defines the length of the rod. The starter filament is frequently about 2 to 10 millimeters in diameter. The diameter of the grown rod is usually at least about 50 millimeters. Economics dictate that larger diameters are desirable. Diameters within the range of about 50 to 200 millimeters are often produced.

The grown rods may be broken into chunks for use in the Czochralski process or retained in rod form for use in the float zone process. The float zone process rods are typically machined to the sought diameters and to remove any morphological irregularities at the extensive surface.

By way of example, polycrystalline silicon is grown on a starter filament of unicrystalline silicon having a diameter of about 7 millimeters and a length of about 1.75 meters within a stainless steel reactor. The filament contains less than 200 ppta boron, less than 200 ppta phosphorus and less than 2 ppma carbon. The starter rod is heated solely by electrical current and is maintained at an average temperature of about 810° C. The reactor wall is maintained at a temperature of less than about 115° F. (46° C.). The silane is produced from metallurgical silicon by reaction with hydrogen chloride to form trichlorosilane which is disproportionated to silane. The only purification of the silane is by distillation. The concentration of silane in the reactor ranges from about 0.5 mole percent initially to 1.5 mole percent at the end of the run. The run is terminated when the diameter of the rod is about 84 millimeters.

Figure 2A:
Figure 2B:

The rod is analyzed by several techniques. FIG. 1 depicts the copper x-ray diffraction pattern exhibited by the rod. The relative intensity of the peak at about 26.85° (2 theta) is about 3 percent of the intensity of the (111) peak. The FWHM of the (111) peak is about 0.32 degrees. Fourier transform photoluminescence indicates for a float zone unicrystalline sample of about 22 to 25 millimeters in diameter, a boron content of 12±2 ppta and a phosphorus content of 13±2 ppta. No aluminum is detected. Fourier transform infra red analysis (cryogenic) indicates a carbon content in the unicrystalline sample of about 0.07 ppma. The resistivity of the unicrystalline sample is in excess of 30,000 ohm centimeters and its lifetime is substantially in excess of 10,000 microseconds. It should be noted that with smaller diameter samples of unicrystalline silicon, the surface area of the sample plays a larger role in adversely affecting lifetimes. Hence, any measurement of the lifetime of the sample is materially confounded with the surface area effects of the sample. FIGS. 2A and B are optical micrographs of a radial cross section (A) of the polycrystalline silicon product and of an axial cross section (B) of the polycrystalline silicon product.

Samples of the trichlorosilane produced polycrystalline silicon were obtained from Hemlock Semiconductor, Inc., Hemlock, Mich. (Sample A) and from Union Carbide Corporation, Czochralski grade (Sample B) and float zone grade (Sample C) and analyzed by various techniques. Table I summarizes some of the analyses.

TABLE I

| SAMPLE | boron, ppta | phosphorus, ppta | carbon, ppma | X-ray relative intensity of 26.85° peak to (111) peak, % | FWHM of (111) peak, ° |
|---|---|---|---|---|---|
| A | 21 | 94 | 0.14 | not detected | 0.113 |
| B | 20 | 65 | 0.18 | — | 0.202 |
| C | 20 | 50 | 0.14 | 1.5 to 1.7 | 0.24 to 0.25 |

Figure 3:
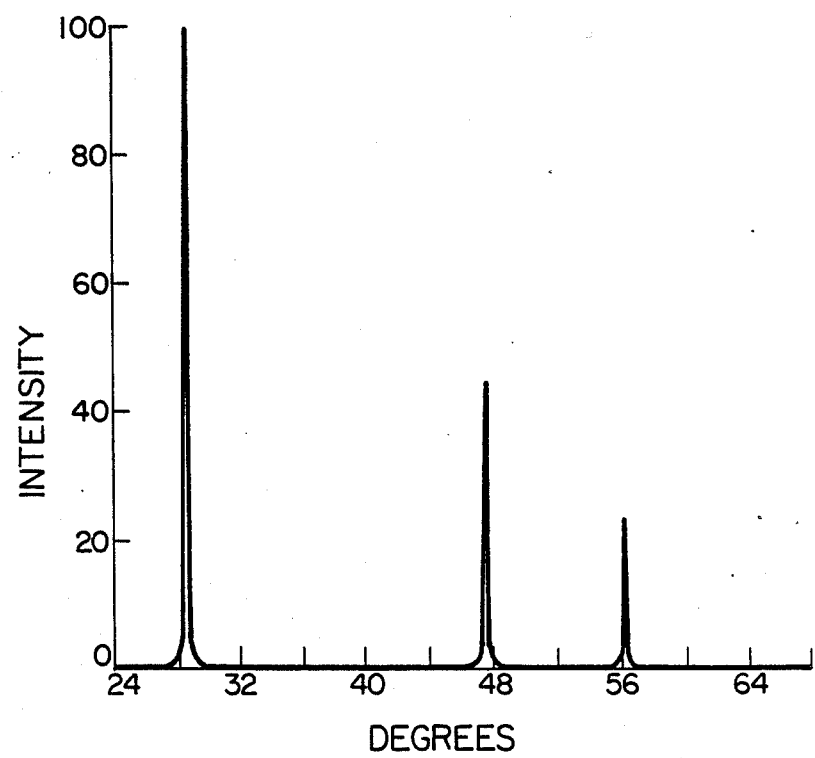
Figure 6A:
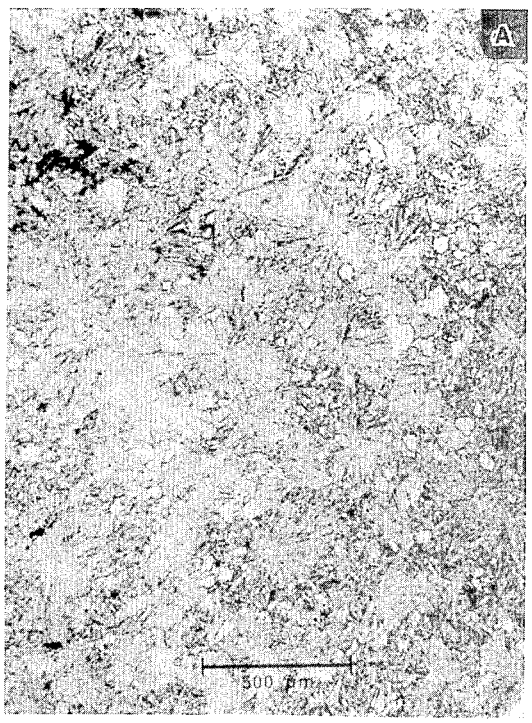
Figure 6B:
Figure 7A:
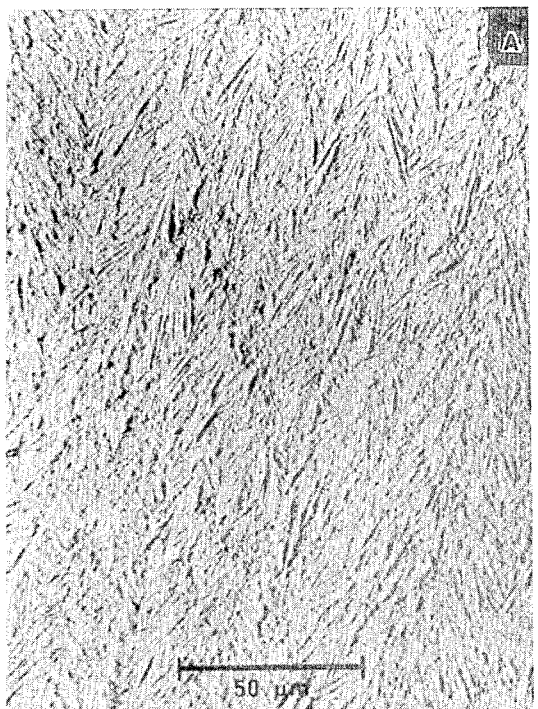
Figure 7B:
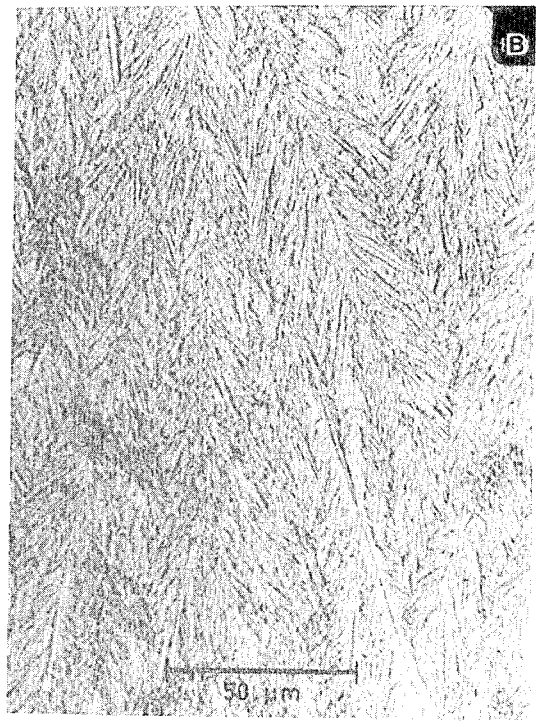

FIGS. 3, 4 and 5 are X-ray patterns of samples A, B and C, respectively. FIGS. 6A and B are optical micrographs of Sample A with FIG. 6A being of a radial cross section and FIG. 6B being of an axial cross section of the polycrystalline silicon. FIGS. 7A and B are optical micrographs of Sample C with FIG. 7A being of a radial cross-section and FIG. 7B being of an axial cross-section of the polycrystalline silicon.

It is claimed:

1. Polycrystalline silicon rod which is capable of providing within no more than two float zoning passes, unicrystalline silicon exhibiting a resistively of at least 10,000 ohm-cm (donor) and a lifetime of at least about 10,000 microseconds, said polycrystalline silicon rod comprising any starter filament used in its manufacture and a polycrystalline growth layer; said rod having a diameter of at least about 50 millimeters and length of at least about 0.5 meters; said polycrystalline silicon growth layer exhibiting an X-ray powder diffraction pattern (copper radiation) having a peak at 26.85±0.25° (2 theta) which is at least about 1.75 percent of the (111) peak and said polycrystalline silicon rod containing less than 15 ppta boron and less than 20 ppta phosphorus.

2. The polycrystalline silicon rod of claim 1 in which the polycrystalline silicon growth layer exhibits a full width at half maximum copper X-ray powder diffraction pattern for the (111) peak of at least 0.27°.

3. The polycrystalline silicon rod of claim 2 which is prepared by the thermal decomposition of silane.

4. The polycrystalline silicon rod of claim 2 in which the full width at half maximum of the (111) peak of the copper X-ray diffraction pattern is about 0.30° to 0.50°.

5. The polycrystalline silicon rod of claim 2 in which the polycrystalline structure of the growth layer is oriented in a direction parallel to the axis of the rod.

6. The polycrystalline silicon rod of claim 1 which contains less than 5 ppta aluminum.

7. The polycrystalline silicon rod of claim 1 which contains less than 0.1 ppma carbon.

8. The polycrystalline silicon rod of claim 1 which contains a starter filament comprising silicon and having a diameter of between about 2 and 10 millimeters.

9. The polycrystalline silicon rod of claim 1 in which the starter filament contains less than 0.2 ppba boron and less than 0.2 ppba phosphorus.

10. The polycrystalline silicon rod of claim 2 in which the unicrystalline silicon from the float zoning exhibits a resistivity of at least 30,000 ohm-cm (donor) and a lifetime of at least 20,000 milliseconds.

* * * * *